United States Patent [19]

Amrhein

[11] Patent Number: 5,274,313
[45] Date of Patent: Dec. 28, 1993

[54] METHOD AND ARRANGEMENT FOR ACTUATING ELECTROMECHANICAL TRANSDUCERS

[75] Inventor: Wolfgang Amrhein, Königsfeld, Fed. Rep. of Germany

[73] Assignee: Papst Licensing GmbH, Spaichingen, Fed. Rep. of Germany

[21] Appl. No.: 681,511

[22] PCT Filed: Dec. 15, 1989

[86] PCT No.: PCT/EP89/01545
§ 371 Date: Aug. 15, 1991
§ 102(e) Date: Aug. 15, 1991

[87] PCT Pub. No.: WO90/07229
PCT Pub. Date: Jun. 28, 1990

[30] Foreign Application Priority Data

Mar. 2, 1988 [CH] Switzerland ............ 763/89
Dec. 15, 1988 [CH] Switzerland ............ 4643/88
Dec. 15, 1988 [CH] Switzerland ............ 4644/88
Apr. 21, 1989 [CH] Switzerland ............ 1523/89
Sep. 15, 1989 [DE] Fed. Rep. of Germany ....... 3930898

[51] Int. Cl.⁵ .................. H02P 6/02; G05B 5/01; G05B 11/06
[52] U.S. Cl. .................. 318/629; 318/561; 318/611; 318/254; 318/632
[58] Field of Search ............... 318/602, 611, 618, 623, 318/629, 630, 652, 254, 432, 632, 685, 701, 561, 653; 310/90, 90.5

[56] References Cited

U.S. PATENT DOCUMENTS

| | | | |
|---|---|---|---|
| 3,839,665 | 10/1974 | Gabor | 318/616 |
| 4,228,396 | 10/1980 | Palombo et al. | 318/272 X |
| 4,270,074 | 5/1981 | Duckworth et al. | . |
| 4,429,262 | 1/1984 | Utenick | . |
| 4,447,771 | 5/1984 | Whited | 381/254 X |
| 4,559,485 | 12/1985 | Whited | 318/802 |
| 4,814,677 | 3/1989 | Plunkett | 318/254 |
| 4,818,908 | 4/1989 | Tamae et al. | 318/138 X |
| 4,841,184 | 6/1989 | Chen et al. | 310/90.5 |
| 4,864,198 | 9/1989 | Takase et al. | 318/254 |
| 4,884,016 | 11/1989 | Aiello | 318/685 |
| 4,922,513 | 5/1990 | Joichi | . |
| 4,999,534 | 3/1991 | Andrianos | 310/90.5 |
| 5,023,528 | 6/1991 | Saidin et al. | 318/254 |

FOREIGN PATENT DOCUMENTS 139006 5/1985 European Pat. Off. .

OTHER PUBLICATIONS

Dr. Wolfgang Amrhein, "Motor-Elektronik-Rundlaufguete", Verlag der Fachvereine an den Schweizerischen Hochschulen und Techniken, Zurich, Sep. 1989, (ISBN 3 7281 1680 7).
G. Champenois et al. "Effective Digital Torque Control Systems . . . ", Proceeding IEEE IECON 88, Pittsburgh, Oct. 2-7; Singapore, Oct. 25-27, 1988, publ. after Aug. 28, 1989.

Primary Examiner—Bentsu Ro
Attorney, Agent, or Firm—Finnegan, Henderson, Farabow, Garrett, and Dunner

[57] ABSTRACT

The invention relates to methods and arrangements for actuating electromechanical transducers, in particular electric motors (3) having a voltage or a current, the optimum curve shape of which is previously determined from the data of a model transducer and which data are stored in a function memory (30). In this way, a prescribed power or torque characteristic, for example without fluctuations, can be achieved.

36 Claims, 9 Drawing Sheets

METHOD AND ARRANGEMENT FOR ACTUATING ELECTROMECHANICAL TRANSDUCERS

BACKGROUND OF THE INVENTION

The invention relates to a method for actuating electromechanical transducers for the purpose of generating a prescribed power characteristic or torque characteristic, in particular for reducing angle-dependent torque fluctuations in electric motors, in which time-dependent or position-dependent (travel-dependent or angle of rotation-dependent) data sets are stored in a function memory, which data sets are called up as a function of the travel or angle of rotation covered in operation or with timing control and are logically connected in an arithmetic switching unit to an input variable to form momentary values, and in which, as a function of the momentary values, voltages or currents with corresponding time-dependent or position-dependent curve shape are impressed into the electrical terminals of the transducer. In addition, an arrangement for carrying out such a process is a subject of the present invention.

An important property, for example of an electric motor, is its concentricity quality (or the uniform power characteristic of an electromechanical transducer). It influences both the accuracy and the stability of a drive system. In order to be able to suppress the disturbing torque pulsations in motors, it is first necessary to localize the cause. Four factors are essentially responsible for the torque fluctuations:

Already with a currentless armature, permanent-magnet torque fluctuations arise, triggered by the interaction of the permanently magnetic materials and the winding grooves or other ferromagnetic components, in motors with permanent-magnet excitation or in motors with iron parts having high residual induction. A rotation of the rotor leads to fluctuations of the overall energy of the magnetic circuit and thus to angle-dependent torques with alternating stable and unstable extreme values.

In contrast with this, the electromagnetic torque fluctuations arise from the interaction of the armature electric loading and the magnetic field. The electromagnetic fluctuations are a result of the special distribution of magnetic fields in the air gap, the winding arrangement and the armature electric loading curve shape as a function of the angle of the rotor.

An angle-dependent change in the motor inductance, as occurs for example with a non-uniform air gap, with partial iron saturation, with a non-uniform material distribution, with respect to the magnetic permeance, and other effects, leads in conjunction with the armature currents to reluctance torque fluctuations.

Torque pulsations in the motor can also have mechanical causes. The mechanical torque fluctuations, as they will be referred to below for the sake of simplicity, are triggered for example by unsymmetrical stresses of the motor shaft such as axle shifts at couplings, eccentric bearing seats etc. They can also result from the load coupled to the motor (or generally transducer).

As a rule, all four types of torque fluctuation referred to occur together in the electric motor but usually with a different order of magnitude of the individual components. There are cases in which individual components are negligible with respect to the others.

Efforts have already been made to improve the concentricity quality of electric motors by constructional measures.

The portion of the permanent-magnet torque fluctuations can be eliminated for example by using a non-iron-containing winding with an annular magnetic yoke (for example: bell-type armature motors). A considerable reduction is already achieved by placing the iron laminated core at an angle, for example by one slot pitch, and by a suitable design of the shape of the magnet and of the slot, tooth or poleshoe geometry. Drive motors which are designed for steady-state motor speeds are frequently equipped with an additional flyweight (for example, record players).

The electromagnetic pole sensitivity (pole cogging) can be favorably influenced for example by means of a selection of the winding design matched to the air gap field and the current curve and thus also by inclining the slot pitch.

The reluctance torque fluctuations can be considerably reduced, inter alia, by using rotationally symmetrically arranged low-retentivity and high-retentivity materials.

However, these known constructional measures for improving the concentricity quality or corresponding measures for achieving a uniform power characteristic of a general, electromechanical transducer (for example linear motor, loudspeaker or the like) come up against limits without achieving complete uniformity. Moreover, such constructional measures frequently make the design more expensive and involve additional tolerance problems or a worsening of the data of such electric motors or transducers.

A different possible way of improving the synchronism is the electrical compensation of the torque pulsations. In the simplest case, an automatic control device ensures improved synchronism, running up or positioning. Further, the demands made on the controller with respect to adaptive control parameters, rapidity and stability cannot always be satisfactorily fulfilled with this method. Therefore, it is suitable to relieve the controller of the oscillatory moments and to generate the current harmonics required for constant torque in accordance with a characteristic line which has been previously determined from the motor data.

A method frequently used with brushless DC motors is to vary the ratio of the switch-on and switch-off range of the square-wave actuation. By means of a corresponding selection of the switch-on range of the different phases, an improved synchronism characteristic is achieved.

A universal and even better matched actuation is obtained by superimposing defined current harmonics. The required summing current curves can deviate considerably from a sinusoidal or square-wave shape. In this way, without external intervention in the motor, the synchronism quality can be considerably improved in a purely electronic manner. The motor developer is now presented with the possibility of optimizing the drive according to other viewpoints (for example, a more favorable production method). However, the greater outlay, in terms of control and power electronics, required for this should not be overlooked. The most recent progress in microelectronics and power transistors makes it considerably easier today to realize such high-quality servodrive systems.

Previous work on the aforementioned subject area is restricted merely to the electronic compensation of the electromagnetic torque fluctuations. This is usually only sufficient for an electric drive if the generated useful torque is very much greater than the other angle-dependent interfering pulses. Generally, this requirement is not fulfilled. Instead, a drive is required here which supplies in an angle-independent manner a constant moment over the entire torque range, i.e. a simultaneous reduction of permanent-magnet torque fluctuations, electromagnetic torque fluctuations, reluctance torque fluctuations and mechanical torque fluctuations or a selection of the latter if one or more components are negligible.

In addition, it is already known from EP-A-180 083 to generate a defined angle-dependent torque by means of corresponding actuation with currents of a particular curve shape. However, with this known measure only reluctance torque fluctuations are reduced, and to be precise also not very extensively since the actuation curves used are symmetrically trapezoidal or sinusoidal with a flattened maximum range.

SUMMARY OF THE INVENTION

The present invention is based on the object of proposing a method and an arrangement for actuating electromechanical transducers for the purpose of generating a prescribed power or torque characteristic in which all the components, at least the most important and most strongly manifest ones affecting the power or torque characteristic and possibly other interfering variables in other directions also are taken into account in order to achieve in particular a good concentricity quality in electric motors, for which purpose it is not necessary to carry out any constructional measures on the motor.

This object is achieved with a method of the type mentioned at the beginning by a plurality of different data sets, determined from the power or torque characteristic of the transducer and possibly from a connected load and taking into account different influences, being stored in the function memory in particular in the form of tables, regulations, equations or functions, by these data sets being called up out of the function memory in a position-dependent manner (for example in the case of a self-controlled synchronous motor) or time-dependent manner (for example in the case of a step motor) and being logically connected in sets, divided up according to the influences, to in each case at least one input variable, and by these logical connection results obtained in this way being combined to form the position-dependent and time-dependent momentary values.

The method according to the invention and a corresponding arrangement have the advantage that a more simple design of the transducer with lower tolerance requirements is obtained and that in the event of the position-dependent power and torque fluctuations being reduced noise reductions are obtained in electric motors and special flywheels in the drives can be dispensed with.

Depending on the type of motor design, it is possible for the purpose of simplifying the actuation to take into account only a number of the influences on the power or torque characteristics. However, in an electromagnetic transducer preferably one of the influences a), c) or d) or at least two of the subsequent influences are taken into account:

a) electromagnetic influences,
b) reluctance influences,
c) permanent-magnet and mechanical influences,
d) mechanical influences (in the transducer and possibly also the connected load).

If, with the corresponding transducer design, one or more of the influences have only a small influence on the power or torque characteristic, these can then be ignored.

In order to be able to compensate interfering forces occuring in other directions than the useful force or the useful torque, in this respect in particular the radial and the axial interfering forces in rotation motors should be mentioned, this can be taken account of by impressing additional, special voltage or current components.

The data sets which take into account the power or torque characteristic of the transducer and possibly the load can be calculated either from the given design and material data or they are calculated indirectly from parameters and/or characteristic lines measured on a model. In the first case, neither a test bench not other measurements are required.

However, it is also possible to determine the data sets which take account of the power or torque characteristic of the transducer and possibly of the load, by measuring passes on a measuring and test bench for optimization for the purpose of achieving the randomly prescribed power or torque characteristic of a model. Although this solution requires a test bench, it permits individual fine adjustment independently of manufacturing and material tolerances, which is not possible by means of calculations. For this solution there are two processes, specifically the direct one (measurement, determining the data sets, operation of the transducer with the data sets) and the iterative process in which the steps of the direct process are followed by the renewed measurement, the correction of the data sets and the operation of the transducer with the corrected values, these subsequent steps being repeated as often as desired.

An expedient arrangement for carrying out the method according to the invention is characterized by a function memory having in each case one memory section per influence to be taken account of for storing the associated data set, an arithmetic switching unit for logically connecting data sets read out of the memory sections to in each case at least one input variable and for combining the logic connection results to form momentary values, a position or time generator assigned to the electromechanical transducer for controlling the position-dependent or time-dependent reading out of the data in the function memory and a power controller for impressing voltages or currents into the electrical terminals of the transducer in accordance with the momentary values.

If the transducer is a multi-phase transducer, for example a multi-phase electric motor, data sets can be stored for each of the individual phases and corresponding momentary values can be derived therefrom, in which case for each of the individual phases corresponding function memories, arithmetic switching units and power controllers or corresponding sections are provided or the latter are operated with time-division multiplexing. In such a case, asymmetries and other deviations between the individual phases of the transducer can be taken account of. However, a simpler solution consists in common data sets being stored for all the phases and either these data sets being read out with a phase shift for the individual phases and logically connected for the individual phases by means of the arithmetic switching units to form momentary values or common momentary values being derived from these common data sets and a phase shifting unit being provided which derives from the common momentary values the momentary values, shifted by the corresponding phase angles, for all the phases. This latter solution requires a smaller degree of outlay but cannot take into account asymmetries between the individual phases as is the case for the first solution.

Further advantageous embodiments of the invention can be found in the further subclaims.

BRIEF DESCRIPTION OF THE DRAWINGS

The invention is explained in greater detail below by means of exemplary embodiments and with reference to the enclosed drawings, in which.

DESCRIPTION OF THE PREFERRED EMBODIMENT

The term "electromechanical transducer" is to be understood to refer to any transducers which produce a mechanical effect from an electric current or a voltage, or vice versa, for example electromagnetic transducers, piezoelectric transducers, electret transducers, thermo transducers. Rotating electric motors and generators (ideal brake) as well as linear motors and loudspeaker drive systems, relays, actuators and pull magnets are important.

Since the mechanical behavior of loads (for example rotating transmissions and general lever transmissions and other transmissions) coupled to the transducers influence the power characteristic or torque characteristic, these can also be taken into account in combination with the transducers.

Power fluctuations can also have effects in directions other than the useful force or the useful moment and are taken into account as required. This applies, for example, to axial or radial interfering forces in rotating transducers which have a indirect rather than direct effect on the operating behavior or cause additional wear or additional noises.

Figure 1:
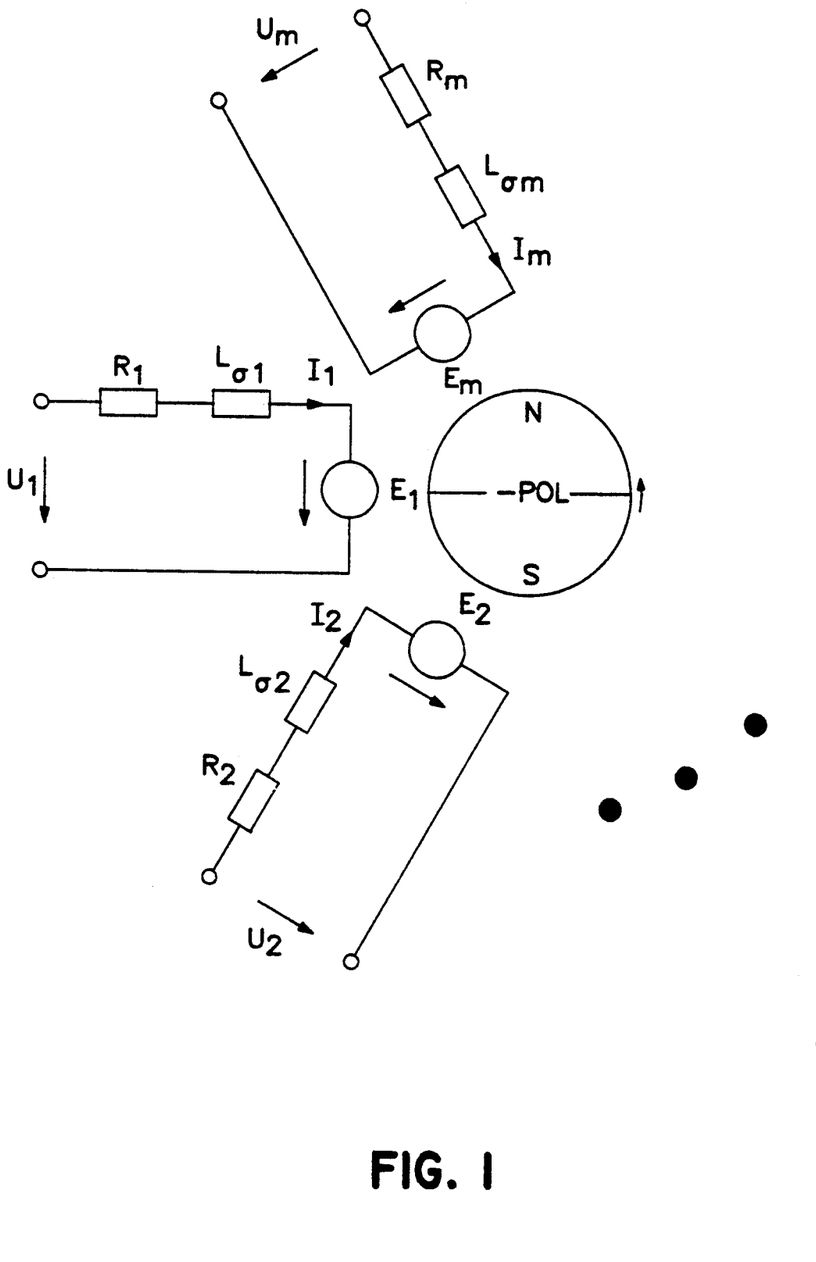
FIG. 1 shows the equivalent circuit diagram of a permanent-magnet-excited synchronous motor.

Firstly, the torque or torque fluctuations will be derived from the motor energy balance by means of the electrical equivalent circuit diagram according to FIG. 1. The torque equation for the equivalent circuit diagram according to FIG. 1 is as follows:

$$T(\delta) = \underbrace{\sum_{k=1}^{m} \left[ \frac{E_k}{\omega}(\delta)I_k(\delta) \right.}_{\text{1. Term (influence } a)} + \underbrace{\frac{1}{2} \sum_{i=1}^{m} \frac{dL_k(\delta)}{d\delta} I_i(\delta)I_k(\delta) \right]}_{\text{2. Term (influence } b)} + \underbrace{T_r(\delta)}_{\substack{\text{3. Term} \\ \text{(influences } c + d)}}$$

where:
T is the resulting torque
$T_r$ is the sum of the permanent-magnet and the mechanical moment fluctuations,
E is the induced phase voltage,
I is the phase current
L is the motor inductance
$\omega$ is the rotor angle speed
$\delta$ is the rotor angle
m is phase number and
i and k are control variable for the motor phases.

As can be recognised from the torque equation, the current change speed is not a contributory factor to the formation of torque. The entire torque consists of four constituents:

a) the electromagnetic component,
b) the reluctance component,
c) the permanent-magnet component, and
d) the mechanical component.

The first term of the torque equation contains the electromagnetic torque constituent. It is determined by the interaction between the magnetic coil fluxes and the associated armature currents. The electromagnetic constituent consists of a constant useful moment and a superimposed pulsation moment.

The second term of the torque equation describes the reluctance moment. An angle-dependent change of the motor inductance, as occurs for example with a non-uniform air gap, leads in conjunction with the armature currents to a resulting torque which, depending on the current supply and design, consists of a constant useful moment and pulsation moment.

The third term of the torque equation shows the permanent-magnet and the mechanical constituent. The latter generates locking moments, due to the interaction between armature slots and permanent-magnets, and thus interfering pulsations. The size of these four components is influenced by the principle and the design of the motor.

If the electromagnetic torque constituent of the torque main equation (1–15) is isolated from the other components, the following is obtained:

$$T_{el} = \frac{1}{\omega} \sum_{k=1}^{m} E_k(\delta)I_k(\delta); \quad (2\text{-}1)$$

with the desired condition $$T_{el} = \text{const.} \quad (2\text{-}2)$$

the relations for the required phase currents shall now be derived.

The equation system (2 -1 ... 2) is underdefined in its present form. An expedient additional condition can be imposed. Here, the requirement for minimum winding losses were selected:

$$P_v = \sum_{k=1}^{m} [R_k I_k(\delta)^2] = \text{minimal}; \quad (2\text{-}3)$$

In order to solve this extreme value task with m variables and the secondary condition (equation 2 -1 and -2), the necessary conditions are determined with the aid of the Lagrangian multiplicator $\lambda$ from the following formulation:

$$\frac{\partial P_v}{\partial I_k} - \lambda \frac{\partial T_{el}}{\partial I_k} = 0; \quad (2\text{-}4)$$

This formulation applies for an independent control of the phase currents. A further additional condition, for example the requirement $$\sum_{k=1}^{m} I_k = 0,$$

requires the introduction of a further Lagrangian multiplicator. However, the dissipated power may rise as a result of this additional condition.

From this the following is obtained:

$$2R_k I_k(\delta) - \lambda \frac{1}{\omega} E_k(\delta) = 0; \quad (2\text{-}5)$$

and $$I_k(\delta) = \lambda \frac{E_k(\delta)}{2\omega R_k}; \quad (2\text{-}6)$$

If equation (-6) is inserted into the torque equation (-1), the following is obtained $$T_{el} = \lambda \frac{1}{2\omega^2} \sum_{k=1}^{m} \frac{E_k(\delta)^2}{R_k}; \quad (2\text{-}7)$$

The Lagrangian multiplicator is thus determined by $$\lambda = \frac{2\omega^2 T_{el}}{\sum_{k=1}^{m} \frac{E_k(\delta)^2}{R_k}}; \quad (2\text{-}8)$$

From the relations (-6) and (-8), the desired current equations of the phases k = 1 ... m are obtained in order to reduce the electromagnetic torque fluctuations:

$$I_k(\delta) = \frac{T_{el} \omega E_k(\delta)}{R_k \sum_{k=1}^{m} \frac{E_k(\delta)^2}{R_k}}; \quad (2\text{-}9)$$

Figure 2:
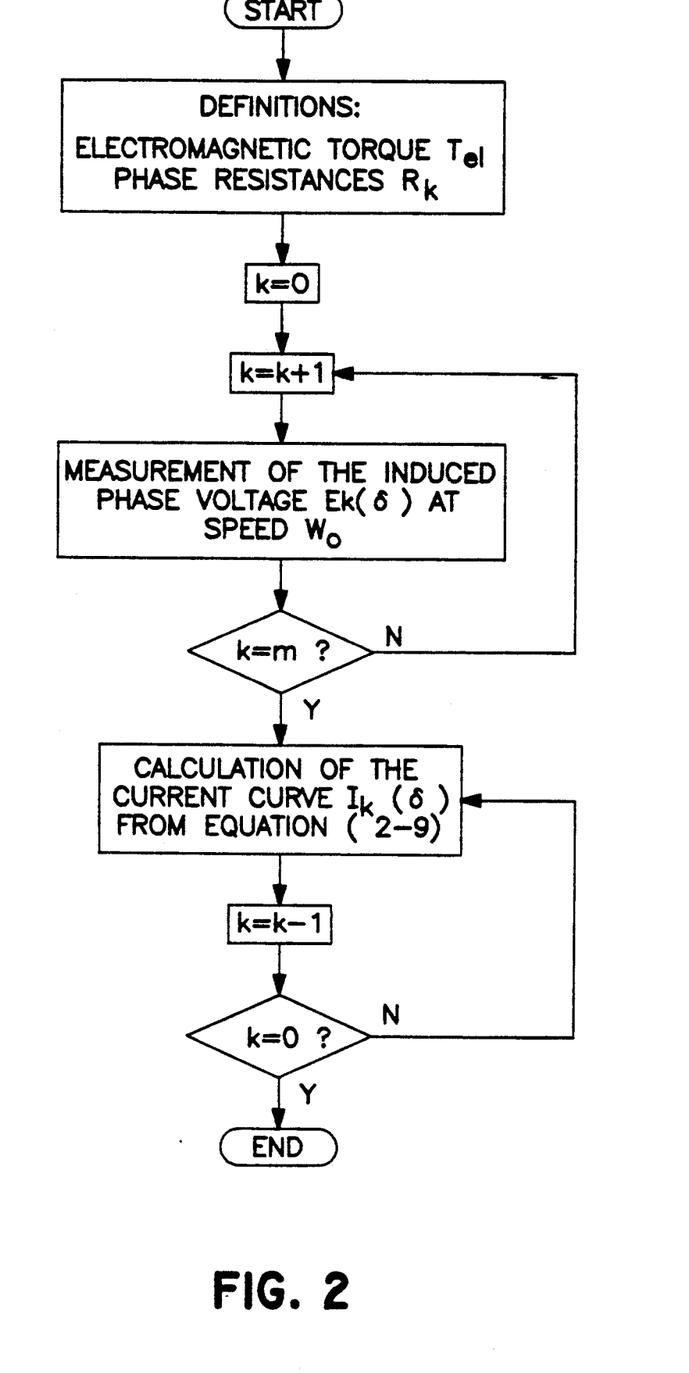
FIG. 2 shows a flow diagram for determining the phase currents for the electric motor for the purpose of reduction of the electromagnetic torque fluctuations.

These phase currents can be determined on a computer-controlled motor test bench (which is explained later) in accordance with the flow diagram in FIG. 2. The current curve shapes for the reduction of the electromagnetic torque fluctuation have been determined for the example of a two-pole electronically commutated motor with four phases. Here, a motor is selected as the example which has both very high electromagnetic and permanent-magnet torque pulsations.

Figure 3:
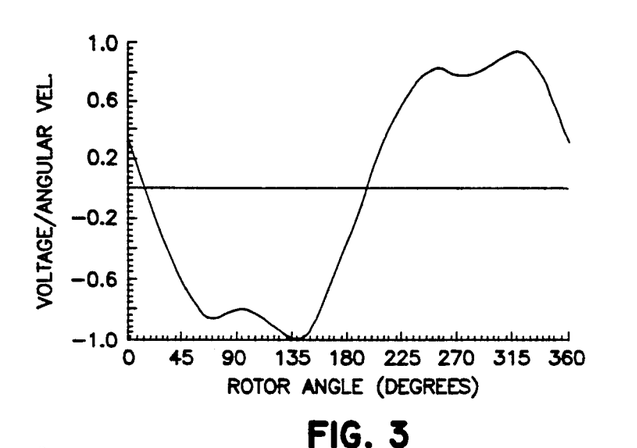
FIG. 3 shows an illustration of the induced voltage in a phase of a four-phase motor in standardized form.

The phase voltage characteristic for a phase of the motor is shown in FIG. 3. The induced voltages were recorded at a very high motor speed (5000 rpm) so that interfering influences due to motor speed fluctuations are negligible. If these measurements have to be carried out at low motor speeds, an additional flyweight would be required. If this motor is fed with the phase current curves determined according to the flow diagram in FIG. 2, a very uniform torque characteristic without fluctuations is obtained. Possible residual interference can be revealed by means of a measurement and can be eliminated by correspondingly matched current curves in a second step or in additional following steps.

In addition to the process described above for calculating the motor phase currents, it is also possible to use a process which is based on the harmonic analysis. In order to compensate the individual torque harmonics the ordinal number of the current harmonics was selected in such a way that they interact with the largest voltage harmonics (fundamental harmonic). The interfering moments occuring here which arise from the interaction of the calculated current harmonics with voltage components whose ordinal number deviates from the fundamental harmonics are calculated and eliminated in steps by means of an iterative correction process.

A comparison of the two calculation methods shows that pratically the same results are achieved, the more rapid and simpler method in terms of solution structure is the direct method described first.

The permanent-magnet locking moment from the torque equation (Eq. 1-15) is a function of the rotor angle $\delta$.

$$T_r = T_r(\delta); \quad (3\text{-}1)$$

In contrast with the electromagnetic torque pulsations, this component is current-independent. The determination of the moment characteristic can occur by means of a field calculation or directly by means of a measurement. The way using the (numeric) field calculations leads, for the already mentioned reasons, partially to very unreliable results. This is compounded by ignorance of the previous history of the rotor magnets which may already be partially demagnetized as a result of excessively high thermal loading or excessively high armature reactive effect. The result of these effects are directly detected in a torque measurement. Two methods are suitable for torque measurement:

TABLE comparison of two measurement principles for ascertaining the static moment.

| selection criteria | measuring method | |
|---|---|---|
| | direct ($\omega = 0$) | indirect ($\omega \neq 0$) |
| duration of the measurement | proportional to the number of angle increments; a high resolution leads to a large measuring time. | independent of angle resolution; very short measuring time (dependent on the rotor speed). |
| Measured variables required for determining the static moment | *motor current and *torque-current characteristic of the drive motor; | in addition: *overall inertia moment of the test system; |

TABLE-continued comparison of two measurement principles for ascertaining the static moment.

| selection criteria | measuring method | |
|---|---|---|
| | direct ($\omega = 0$) | indirect ($\omega \neq 0$) |
| | *angle position; | *speed dependence of the frictional moment; *determining the angle speed and acceleration from $\phi(t)$. |
| Unreliability of the measurement result | very small; | more unreliable due to additonally required measurement parameters. |
| overall outlay | more extensive hardware; | larger computing outlay for evalution. |

*the direct measurement of the static moment $T_r(\delta)$, and
*the indirect determination of the static moment by means of a dynamic torque measurement (where $\omega \neq 0$).

Figure 4:
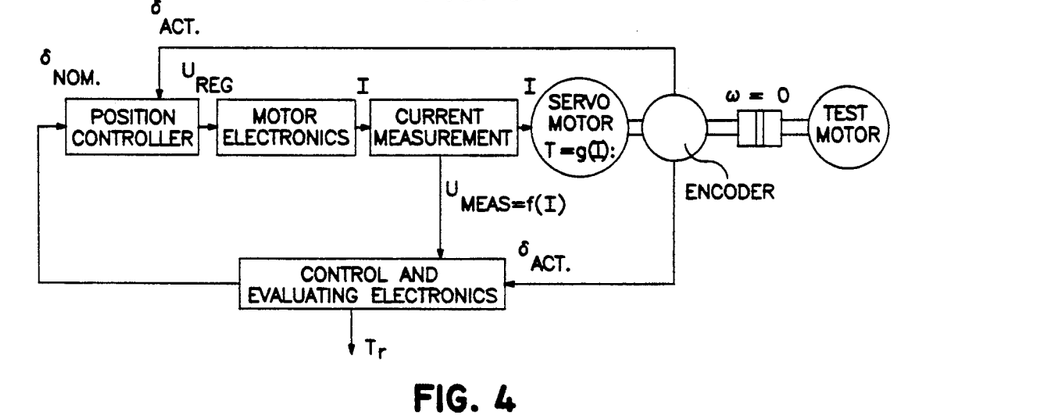
FIG. 4 shows the circuit diagram of a device for the direct measurement of the static torque of a model motor.
Figure 5:
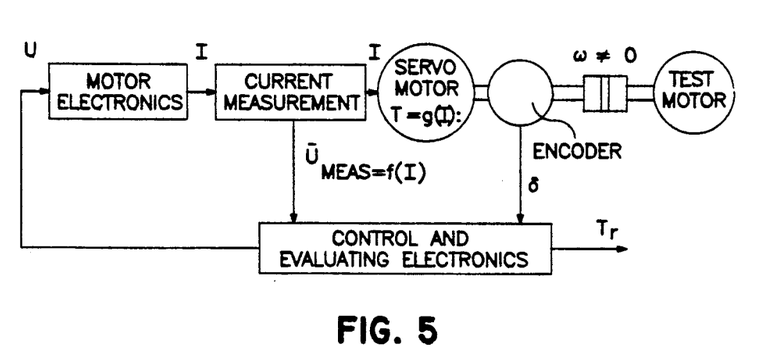
FIG. 5 shows the circuit diagram for an indirect measurement of the static torque of a model motor.

The functional blocks of the two variants are set out opposite one another in FIGS. 4 and 5. A comparison of the above table leads to the result that both methods are justified depending on the priorities selected.

For the following description, the method of dynamic torque measurement is selected. Further details regarding the test bench can be found in a patent application entitled: "Measuring and Test Bench for Electromechanical Transducers" (same inventor, same applicant, same day of application).

The derivation of the equation system for the compensation of the permanent-magnet and mechanical constituent begins with the illustration of the dynamic motion equation for the measurement system according to FIG. 5. The drive servomotor is controlled by means of a controllable voltage source in such a way that at the smallest possible motor speed the permanent-magnet tilt moment of the currentless test motor is just overcome. The moment which occurs can be measured in the stationary state by means of the armature current of the drive motor.

$$T = f(I(\delta)); \qquad (3\text{-}2)$$

For a DC bell-type armature motor with a very high number of collector laminars, the relationship between moment and armature current is linear to a very good approximation. The equation 3 -2 is simplified by using the torque constants $k_T$ as:

$$T = k_T I(\delta); \qquad (3\text{-}3)$$

The measurable torque is composed of three components which are considered below.

The first term is formed by the angle-dependent torque:

$$T_1 = T_r(\delta); \qquad (3\text{-}4)$$

The locking moment $T_r$ is triggered by a superimposition of the permanent-magnet moment fluctuations, the mechanical moment fluctuations and the motor speed-independent frictional moment constituent.

The second term is determined by motor speed-dependent moment constituents:

$$T_2 = T_2(\omega) = g(\delta)\frac{d\delta}{dt}; \qquad (3\text{-}5)$$

Depending on the motor design and operating range, the function $T_2(\omega)$ may depend on the motor speed in a linear or even strongly non-linear fashion. Influencing variables are bearing and brush friction, air friction, eddy current moments and hysteresis brake moments.

Finally, the third term is the acceleration moment dependent on the mass inertia moment of the entire rotating system.

$$T_3 = T_3(\omega) = (J_p + J_b + J_o)\frac{d\delta^2}{d^2 t} = J\frac{d\delta^2}{d^2 t}; \qquad (3\text{-}6)$$

where $J_p$: inertia moment of the test motor,
$J_b$: inertia moment of the brake,
$J_o$: other inertia moments (e.g. clutch, angle generator).

The torque balance from the equations (3 -2, -4, -5 and -6) is as follows:

$$f(I(\delta)) = J\frac{d\delta^2}{d^2 t} + g(\delta)\frac{d\delta}{dt} + T_r(\delta); \qquad (3\text{-}7)$$

After conversion, the angle-dependent locking moment is obtained as:

$$T_r(\delta) = f(I(\delta)) - J\frac{d\delta^2}{d^2 t} - g(\delta)\frac{d\delta}{dt}; \qquad (3\text{-}8)$$

Therefore, the following condition equation is to be fulfilled for the compensation of the permanent-magnet and mechanical torque fluctuations:

$$T_r(\delta) + T_c(\delta) = 0; \qquad (3\text{-}9)$$

The relation for the phase currents which generate the electromagnetic compensation moment $T_c$ can be derived by using equation (2 -9). The exact solution using the secondary condition of minimum losses is:

$$I_k(\delta) = -\frac{T_r(\delta)\omega E_k(\delta)}{R_k \sum\limits_{k=1}^{m} \frac{E_k(\delta)^2}{R_k}}; \qquad (3\text{-}10)$$

where $T_r(\delta)$ is in accordance with equation (3 -8).

Here, as in the compensation of the electromagnetic torque fluctuations, the current curve can also be alternatively determined on the basis of a harmonic analysis.

Figure 6A:
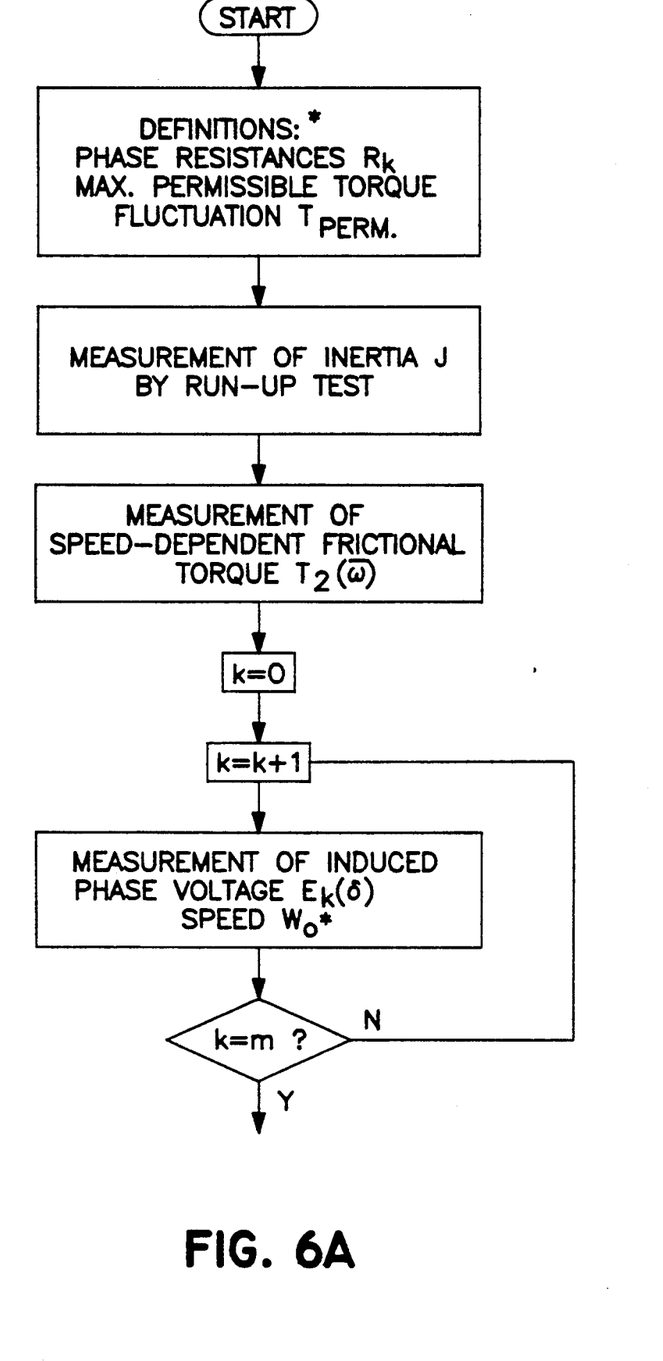
FIG. 6 shows a flow diagram for iteratively determining the phase currents for the reduction of the permanent-magnet and mechanical torque fluctuations of a motor, divided up into three parts (FIG. 6a, 6b and 6c)
Figure 6B:
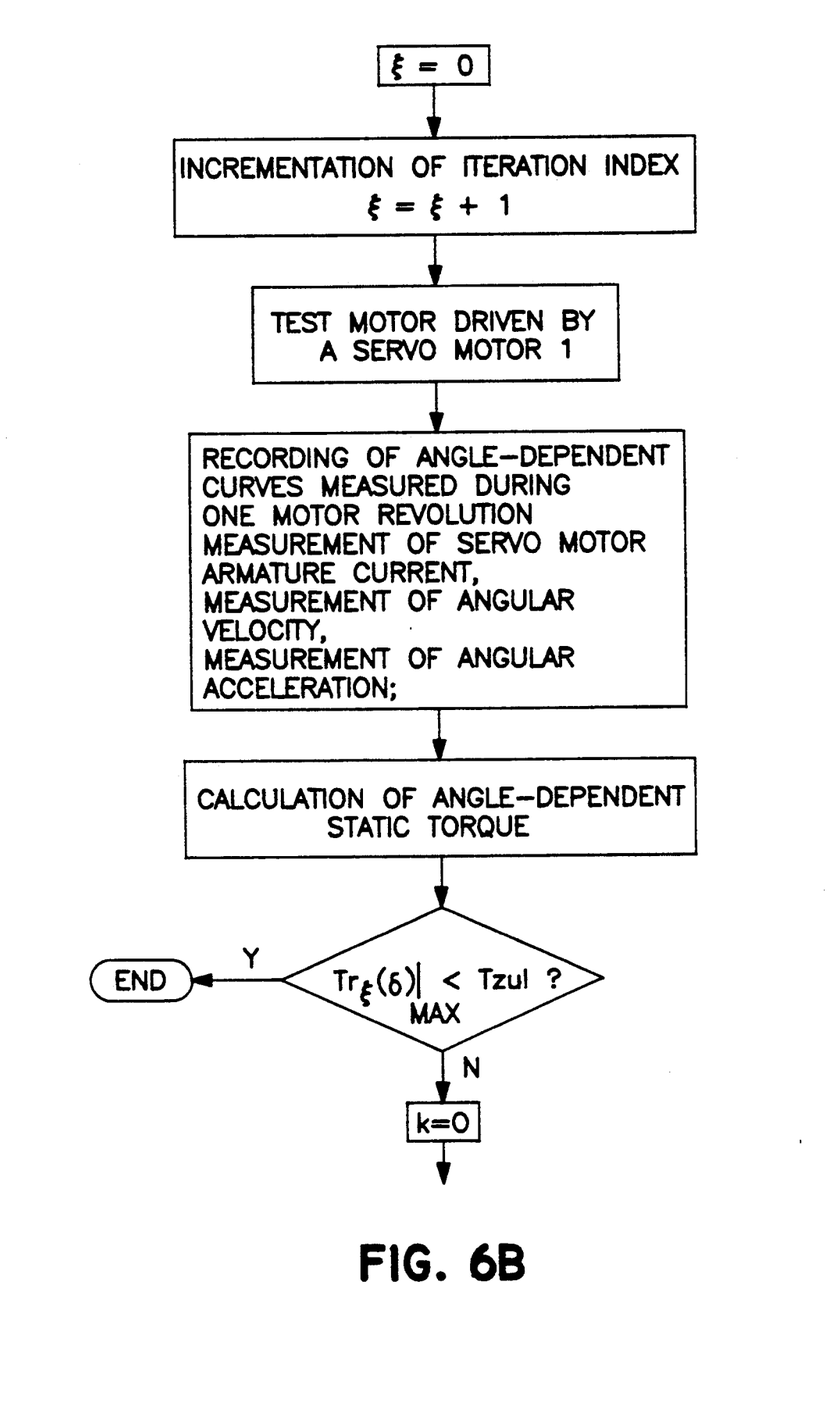
Figure 6C:
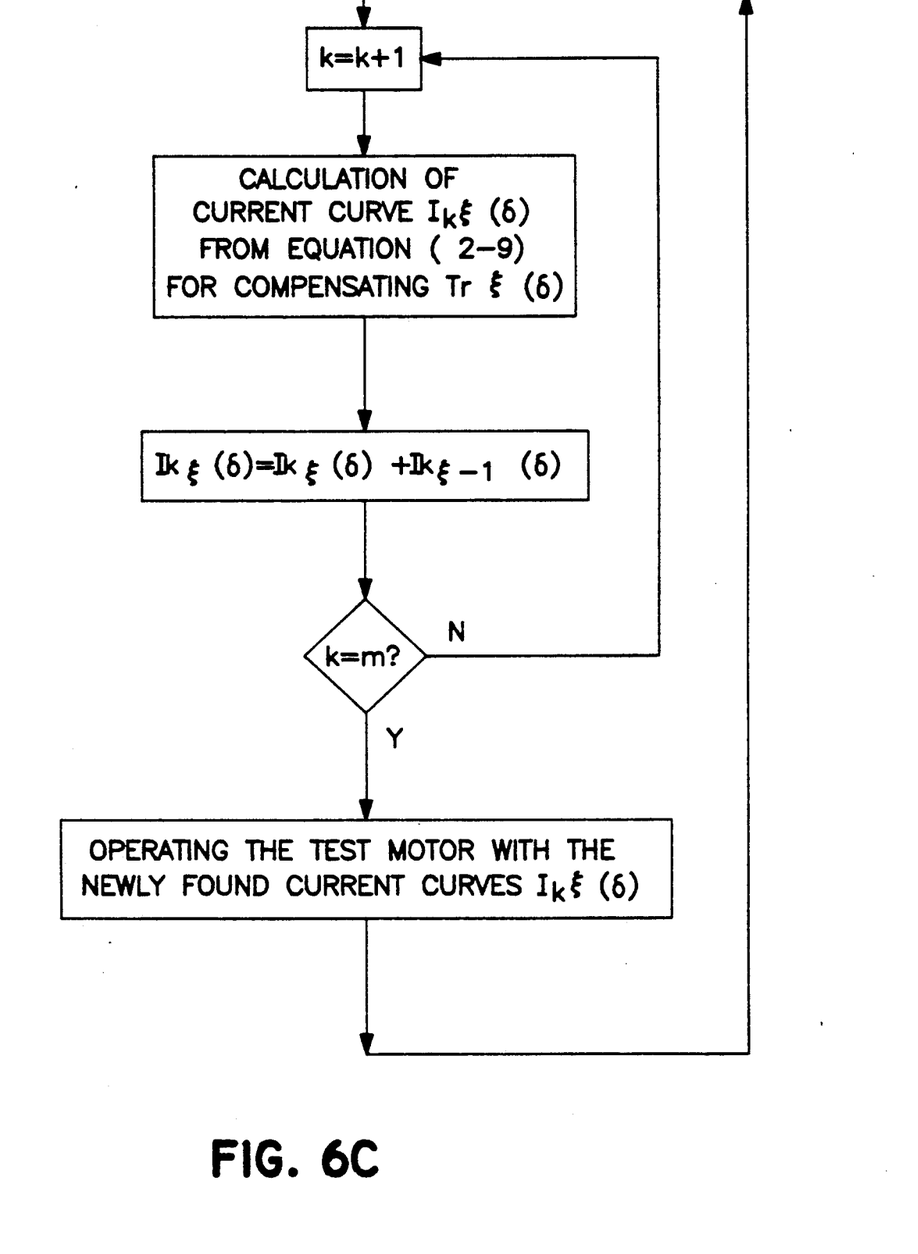

The sequence of calculation of the phase current curves can be seen from the flow diagram according to FIG. 6 ( with the components FIGS., 6a, 6b and 6c). The measurements on the motor which are required for the calculation are carried out fully automatically on a measuring and test bench so that the motor can then be operated and tested with the determined correction curve.

Figure 7:
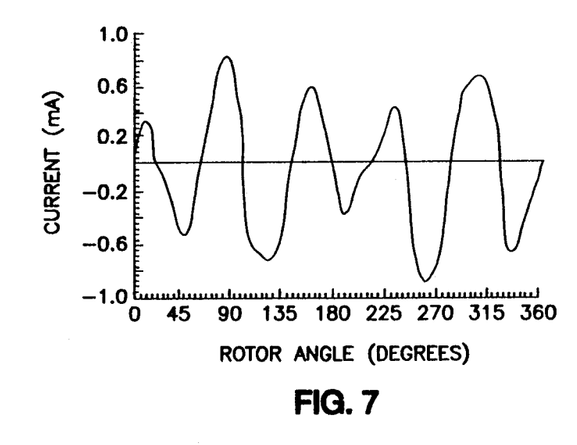
FIG. 7 shows an illustration of the current curve, determined iteratively in accordance with the flow diagram of FIG. 6 for a phase in standardized form.
Figure 8:
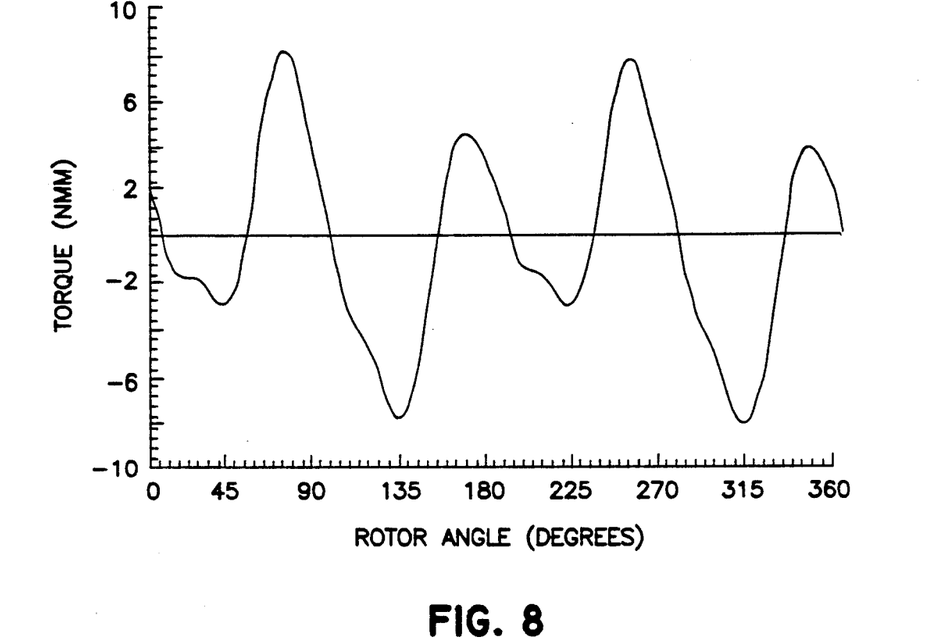
FIG. 8 shows an illustration of the permanent-magnet and mechanical torque fluctuations of the test motor in the static state before an electronic correction (without frictional moment)
Figure 9:
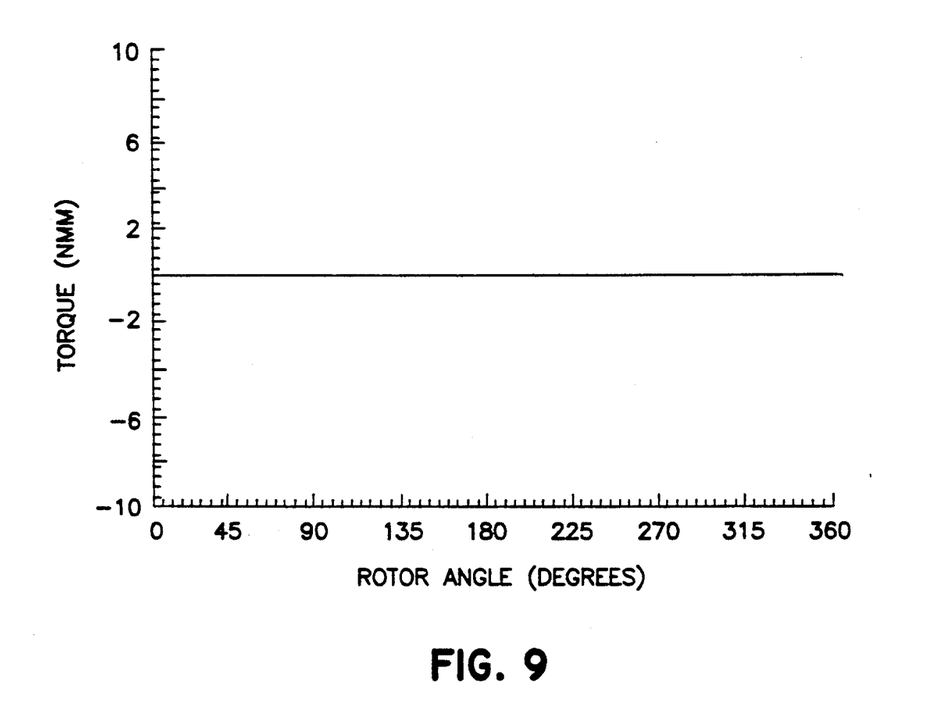
FIG. 9 shows an illustration of the torque fluctuations similar to FIG. 8 but after the electronic corrections.

FIG. 7 shows in standardized form the current curve for a motor phase determined with the iterative method according to the flow diagram in FIG. 6, for the compensation of permanent-magnet and mechanical torque fluctuations. FIGS. 8 and 9 show curves for the static torque before and after the electronic correction.

Figure 10:
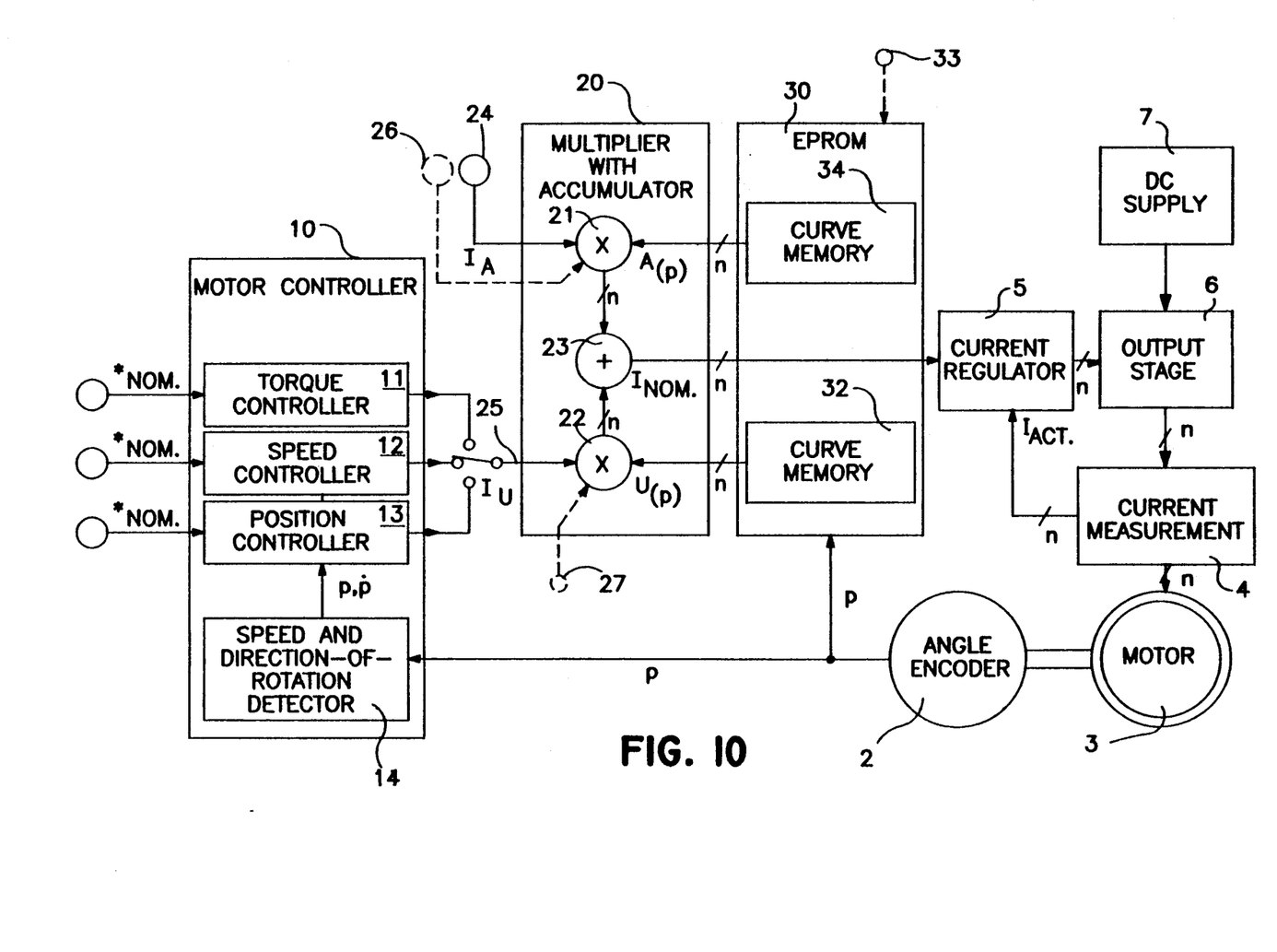
FIG. 10 shows the block circuit diagram in a simplified illustration of an arrangement for actuating an electromechanical transducer in the form of an electric motor.

FIG. 10 shows an exemplary embodiment in a diagrammatic illustration of an arrangement for actuating electromechanical transducers, in the present case of an electric motor. The circuit arrangement according to FIG. 10 contains a motor controller 10, an arithmetic switching unit 20, a function memory 30 and a power supply for the motor 3 which consists in the present example of a current controller 5, an output stage 6, a DC voltage power supply 7 and a current measuring device 4. The arithmetic switching unit contains two multipliers 21 and 22 and a logical connection circuit in the form of an accumulator (summing device) 23, the output signal of which actuates the current controller 5. The function memory 30 contains in the present case two curve memories 31 and 32 so that two different terms can be taken into account. If further terms have to be processed, for example for compensating reluctance interfering influences or interfering influences acting in directions other than the useful force or the useful torque, the arithmetic switching unit 20 and the function memory 30 are to be expanded with the corresponding elements. In such a case, it is possible that the logical connections do not occur multiplicatively and additively, as shown in FIG. 10, but rather by means of different corresponding functional logical connections.

Even if, in the circuit arrangement according to FIG. 10, in each case only one memory section 31, 32 per influence variable is shown in the function memory 30, each of the memory sections can be divided up into several components so that different data sets can be stored per influencing variable. These different data sets are then selected by means of an input variable 33.

In the present case, the motor controller 10 contains a torque control 11, a motor speed controller 12 and a position controller 13, the output signals of which are connected optionally via a change-over switch to an input 25 of the arithmetic switching unit 20, as well as a motor speed and direction of rotation detecting device 14. In addition, an input 24 is provided for the arithmetic switching unit. The motor 3 is coupled to an angular position encoder 2 in order to supply corresponding angular position signals for the function memory 30 and for the motor controller 10.

In a way which is representative of a multiplicity of correction or control elements (input variables), the input 26 or 27 is labeled for a possible evaluation of the multiplication factors 24 or 25. The input variable 33 makes a decision by selecting special curves for taking into account different operating states (non-linear operation due to iron saturation and armature reactive effects, temperature) and motor operating modes (e.g. uniform operation or pulsing operation as step motor).

The following input variables are of interest with respect to the circuit arrangement: control variables for the amplitudes of the stored, standardized curve or of the curve generator, possibly a signal variable which makes it possible to read out the curves in a time-dependent manner or as a function of the rotor position, control or signal variables for selecting the curves and possibly for changing the curve shape in particular with a non-linear motor characteristic, in which case the curve shape is to be matched to the operating state. Furthermore, control variables, for example, for an arithmetic switching unit 20 can occur which control the sequence of the logical connection of control variables and curves or change the logical connection function in accordance with the operating state of the motor. Digital, analog or other signal variables which possibly impress defined currents or voltages on the motor phases by means of a power controller in order to improve the concentricity quality of the motor or generally the operating characteristic are produced as output variables.

The data for curves which lead to the compensation of the individual torque fluctuation modes is deposited in the function memory 30. The data can be stored in the form of tables, regulations (e.g. limitation on the maximum current amplitude), equations or functions. Depending on the symmetry of the magnetic and electric circuit, it is necessary to deposit the curves for all the phases separately or only one curve per torque fluctuation mode. In the latter case, the curves are read out shifted by the phase shift angle. Curve generators which generate the defined curves can also take the place of the function memories 30.

An arithmetic switching unit 20 now logically connects the curve amplitudes, made available in a time-dependent or rotor angle-dependent manner, to the input control variables in accordance with defined functions. However, in the present case the logical connection elements 21, 22 or adding elements 23 are employed; under certain circumstances other logical connection elements are necessary for taking into account other influencing variables.

In the circuit arrangement according to FIG. 10, the current curve values, calculated for a rotor rotation, of the individual phases, for the purpose of reducing the electromagnetic torque fluctuation (curve memory 32) and the permanent-magnet fluctuation, including the mechanical fluctuation (curve memory 31) are separated and deposited in standardized form.

In accordance with the rotor angle $\phi$, the current curve of the curve memory 31 is read out and multiplied by a current amplitude $i_A$ (input 24). The amplitude $i_A$ is selected in such a way that the permanent-magnet torque fluctuations are minimal. The amplitude $i_A$ is also contained in the stored data set. In motors with a non-saturated iron circuit and negligible armature reactive effect the amplitude can be kept constant. Otherwise, the value is to be adjusted in accordance with conditions. The current curve generated in this way flows unchanged into the individual phase windings independently of the operating state of the motor and thus compensates the torque pulsations which have permanent-magnet and mechanical causes.

On the condition that the motor has a linear current-torque characteristic, which is usually the case with permanent-magnetic-excited motors, the actual operating curve can now be superimposed additively on the current curve:

$$i_{permanent} = i_A A(\phi)$$

It arises from the product of the controller-current amplitude and the current curve B ($\phi$) intended for compensating the electromagnetic torque fluctuations:

$$i_{el-magn} = i_B B(\phi)$$

If the respective motor has a non-linear behavior, it is expedient to use different curves per type of torque fluctuation for different operating areas. This can occur for example by implementing a curve selection switch as a function of the operating state of the motor, which switch selects via an input 33 the corresponding sections of the memory sections 31, 32 etc. or the curves are changed in an appropriate way so that they are better matched to the respective operating state. Matching can however also occur by changing the input control variables 26, 27.

If the reluctance torque fluctuations or other influences are not negligible, a further third path or other further paths consisting of an additional memory section and a logical connection element (not shown) can be added to the circuit according to FIG. 10, said path permitting the reluctance fluctuations to be reduced by appropriate current circuits.

It is apparent from the torque equation given at the beginning that this term can be dependent on the self-inductances and mutual inductances as well as on the individual phase currents. It is possible to deposit the necessary information for the current curve generation as data sets in the form of table values, regulations, equations or functions or to calculate the information directly from the respective operating state.

The electrical circuit can be realized in different ways. It can be constructed, for example purely in hardware terms, from analog and/or digital components or it can also be realized in software terms by means of a computing program. In addition, a moment control and a position control, speed control or acceleration control can be superimposed on the electrical circuit. In the case shown, the overall circuit has the structure of a cascade control. In the motor controller 10, internally there is a speed controller 12 subordinate to the position controller 13 and externally a current controller 5 subordinate to the said speed controller 12.

The essential difference with respect to other position, speed, acceleration and moment controls resides in the fact that due to the selected current curve control any possible moment fluctuations are already suppressed at the start and thus the superimposed control circuits are relieved to a very great extent. The controllers only still have to be configured for a fine correction. One controller for impressing a torque can be dispensed with entirely.

By means of these measures which have been presented, the operating behavior of the motor with respect to moment fluctuations and also speed fluctuations is substantially improved. Further improvements are a lower generation of noise, better efficiency and lower operating temperatures.

The proposed electronic circuit is suitable for actuating motors with any desired current curves. If an additional pulse generator with controllable frequency is added parallel to the angular-position encoder 2, this circuit is suitable for the universal operation of all types of small electrical motors, that is to say for remote-controlled and non-position-controlled motors such as general synchronous motors, step motors, asynchronous motors etc. For the fedback operation, the angular-position encoder 2 is connected into the electrical circuit and for the controlled operation the pulse generator is connected into the electrical circuit.

Figure 11:
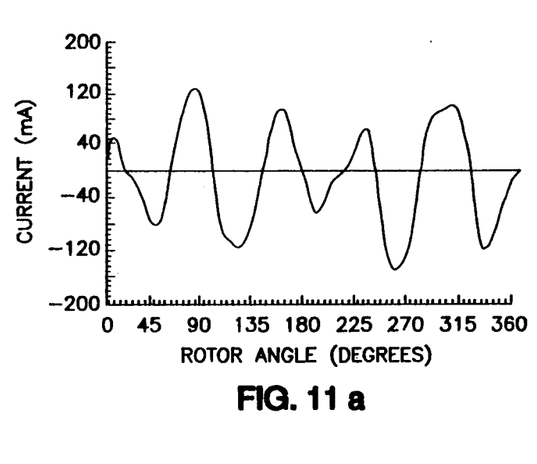
FIG. 11a–c show illustrations of the phase current curves of the test motor in the currentless state with a current of 0.1 A and with a current of 0.5 A.

FIGS. 11a, 11b and 11c now show for one phase current curves for achieving different constant nominal torques, such as are applied for example by means of the circuit arrangement according to FIG. 10 to the motor 3. These curves take into account both constituents of torque fluctuations, namely the electromagnetic and the permanent-magnet fluctuations. Phase current curves for three different operating states of the motor 3 are shown, specifically for the currentless state (FIG. 11a) for a current of 0.1 A (FIG. 11b) and for a current of 0.5 A (FIG. 11c). In these cases, a very uniform torque characteristic without fluctuations is obtained.

I claim:

1. A method for controlling an electro-mechanical transducer incorporating at least a stationary part and a movable part, comprising the steps of:
    obtaining at least two distinct sets of data specific to said transducer, each said set of data relating to a type of perturbation known to occur in operation of said transducer and being in machine-usable form;
    determining in response to actual energization of said transducer at least one of elapsed time, linear position and angular position of the movable part to obtain a determined value; and
    modifying the energization of said transducer according to a schedule responsive to representative data from said two sets of data and to the determined value to compensate for said known perturbations, thereby to improve the operation of said transducer.

2. The method for controlling a transducer according to claim 1, wherein the step of obtaining a first set of data comprises obtaining a representative datum from the first data set with an access signal to obtain a drive current corrective signal to compensate for a deviation in operation caused by an expected perturbation in response to an electromagnetic forcing parameter in a single repetitive portion of motion of said transducer.

3. The method for controlling a transducer according to claim 1, wherein
    the obtaining step obtains via access signals the representative data from the respective first and at least second sets of data which sets relate to perturbations of motive force of the transducer which are respectively caused by at least two different ones of the following four types of influences:
    a) electromagnetic influences,
    b) reluctance influences,
    c) permanent magnet influences, and
    d) mechanical influences other than permanent magnet influences, which mechanical influences are dependent on at least one of speed and position.

4. The method for controlling a transducer according to claim 1, wherein
    the obtaining step obtains the second set of data, which second set takes account of perturbations of motive force of the transducer caused by permanent magnet influences to produce a second corrective signal, and
    the modifying step modifies the energization of the transducer on a time scale commensurate with the time scale of the perturbations caused by the permanent magnet influences.

5. The method for controlling a transducer according to claim 1, wherein
    the obtaining step obtains one of the sets of data, which has values sufficiently closely spaced with respect to transducer position to compensate for deviations in operation caused by harmonics of a desired motive force.

6. The method for controlling a transducer according to claim 1, wherein
    the first and second sets of data are obtained by a preliminary step of calculating the data based on the structure and material of the transducer.

7. The method for controlling a transducer according to claim 1, wherein
the first and second sets of data are obtained by a preliminary step of calculating the data based on measurements of parameters and of energization response characteristics of a model of the transducer.

8. The method for controlling a transducer according to claim 7, wherein
the preliminary step of calculating is based in part on measurement of the energization response characteristics with energization sufficient to achieve a desired motive force.

9. The method for controlling a transducer according to claim 1, wherein
the first and second data sets are obtained by a preliminary step of calculating the data based in part on the influences of a load coupled to the transducer.

10. The method for controlling a transducer according to claim 1, wherein
the step of obtaining at least two distinct sets of data includes the step of producing signals from one of the first and second data sets which signals are variable to match motive-force-related characteristic dependent on a non-linear property of the transducer, which property varies within a respective repetitive portion of motion of the transducer.

11. The method of controlling a transducer according to claim 10, wherein
the non-linear property is one of the group consisting of iron saturation and armature reactive effect, and
the step of producing signals includes the sub-step of switching among data sets corresponding respectively to members of group consisting of iron saturation and armature reactive effect to obtain the first set of data.

12. The method for controlling a transducer according to claim 11, wherein
the sub-step of switching among sets of data comprises switching among the sets of data dependent upon the operating state of the transducer.

13. The method for controlling a transducer according to claim 1, wherein the determining step includes initially measuring at least one of elapsed time, linear position and angular position of the movable part and thereafter calculating a value to obtain the determined value.

14. The method for controlling a transducer according to claim 13, wherein
the obtaining step obtains via access signals the representative data from the respective first and at least second sets of data which sets relate respectively to perturbations of motive force of the transducer which are respectively caused by at least two different ones of the following four types of influences:
a) electromagnetic influences,
b) reluctance influences,
c) permanent magnet influences, and
d) mechanical influences other than permanent magnet influences, which mechanical influences are dependent on at least one of speed and position.

15. The method for controlling a transducer according to claim 13, wherein
the obtaining step obtains one of the sets of data, which has values sufficiently closely spaced with respect to transducer position to compensate for deviations in operation caused by harmonics of a desired motive force.

16. The method for controlling a transducer according to claim 13, wherein
the first and second sets of data are obtained by a preliminary step of calculating the data based on the structure and material of the transducer.

17. The method for controlling a transducer according to claim 13, wherein
the first and second sets of data are obtained by a preliminary step of calculating the data based on measurements of parameters and of energization response characteristics of a model of the transducer.

18. The method for controlling a transducer according to claim 13, wherein
the step of obtaining at least two distinct sets of data includes the step of producing signals from one of the first and second sets of data which signals are variable to match a motive-force-related characteristic dependent on a non-linear property of the transducer, which property varies within a respective repetitive portion of motion of the transducer.

19. The method for controlling a transducer according to claim 18, wherein
the non-linear property is one of the group consisting of iron saturation and armature reactive effect, and
the step of producing signals includes the sub-step of switching among sets of data corresponding respectively to members of group consisting of iron saturation and armature reactive effect to obtain the first set of data.

20. The method for controlling a transducer according to claim 19, wherein
the sub-step of switching among sets of data comprises switching among the sets of data dependent upon the operating state of the transducer.

21. The method for controlling a transducer according to any one of claims 10, 11, 12, 18, 19 and 20, wherein
the step of producing signals, in appropriate ones of its sub-steps, includes providing arithmetic logic units to combine a selected datum with other relevant control values.

22. The method for controlling a transducer according to any one of claims 10, 11, 12, 18, 19 and 20, wherein
the step of producing signals, in appropriate ones of its sub-steps, includes providing phase-shifting units to modify a selected set of data.

23. A method for controlling an electro-mechanical transducer including at least a movable part, comprising the steps of:
providing signals for scheduling performance of the transducer, including the sub-steps of:
obtaining at least two distinct sets of data specific to said transducer, each said set of data relating to perturbations known to occur in the operation of said transducer and being in machine-usable form;
determining in response to actual energization of said transducer at least one of elapsed time, linear position and angular position of the movable part to obtain a determined value; and
modifying the energization of said transducer according to a schedule responsive to representative data from said two sets of data and to the determined value to compensate for said know perturbations, thereby to improve the operation of said transducer; and the method further including subjecting the modified energization of the transducer to a closed loop control for the transducer, the representative data from the first and second data sets and the determined value contributing to the closed loop control.

24. A method for controlling an electro-mechanical transducer including at least a movable part, comprising the steps of:

providing signals for scheduling performance of the transducer, including the sub-steps of:

obtaining at least two distinct sets of data specific to said transducer, each said set of data relating to perturbations known to occur in the operation of said transducer and being in machine-usable form;

determining in response to actual energization of said transducer at least one of elapsed time, linear position and angular position of the movable part to obtain a determined value; and modifying the energization of said transducer according to a schedule including corrective signals responsive to representative data from said two sets of data and to the determined value to compensate for said known perturbations, thereby to improve the operation of said transducer;

the signals providing step further including providing signals to access the representative data in the two sets of data; the method further including feeding the corrective signals into a closed loop control for the transducer;

measuring the position and the speed of the transducer to provide status signals; and applying the status signals to modify the corrective signals.

25. A method for controlling a mechanical-electrical transducer incorporating at least a movable part and an electrical output circuit, comprising the steps of:

obtaining at least two distinct sets of data specific to said transducer, each said set of data relating to a type of perturbation known to occur in the operation of said transducer and being in machine-usable form;

determining in response to actual movement of said transducer at least one of elapsed time, position of the movable part and transduced output of said transducer to obtain a determined value;

modifying the energization including movement of said transducer according to a schedule responsive to representative data from said two sets of data and to the determined value to compensate for said known perturbations, thereby to improve the output of the electrical output circuit of said transducer.

26. A method for controlling an electro-mechanical transducer incorporating at least a stationary part and a movable part, comprising the steps of:

obtaining at least two distinct sets of data specific to said transducer, each said set of data relating to a respective type of perturbation known to occur in operation of said transducer and being in machine-usable form;

determining in response to actual energization of said transducer at least one of elapsed time, current consumption of said transducer, voltage supply to said transducer, linear position and angular position of the movable part to obtain at least one determined value, and corresponding to the at least one determined value at least one access signal; and modifying the energization of said transducer according to a schedule responsive to representative data from said two sets of data accessed in response to the at least one access signal to compensate for said known perturbations.

27. The method for controlling an electro-mechanical transducer according to claim 26, wherein the step of obtaining data comprises obtaining a first ordered sequence of data by accessing one of the at least two data sets with the at least one access signal; and the modifying step comprises applying the first ordered sequence of data to a voltage or current generating means via a corrective signal to compensate for a deviation of parameters of motion caused by a known perturbation in response to an electromagnetic forcing parameter in a single repetitive portion of motion of said transducer.

28. The method for controlling an electro-mechanical transducer according to claim 26, wherein the step of obtaining data comprises obtaining a first ordered sequence of data by accessing one of the at least two data sets with the at least one access signal; and the modifying step comprises applying the first ordered sequence of data to a voltage or current generating means via a corrective signal to compensate for a deviation of parameters of motion caused by a known perturbation in response to an electromagnetic forcing parameter.

29. The method for controlling an electro-mechanical transducer according to claim 26, comprising also mechanical components, wherein the step of obtaining data comprises obtaining an ordered sequence of data by accessing one and at least another of the at least two data sets with the at least one access signal, the one and the at least another of the at least two data sets respectively relating to different known perturbations of the motion of the transducer, respectively produced by influences selected from the following types and combinations of the following types involving less than all of them:

a) electromagnetic influences,
b) reluctance influences,
c) permanent magnet influences, and
d) mechanical influences other than permanent magnet influences.

30. The method for controlling an electro-mechanical transducer according to claim 26, comprising also mechanical components, wherein the step of obtaining data comprises obtaining an ordered sequence of data by accessing one and at least another of the at least two data sets with the at least one access signal, the one and the at least another of the at least two data sets respectively relating to different known perturbations of the motion of the transducer, respectively produced by influences selected from the following types and combinations of the following types involving less than all of them:

a) electromagnetic influences,
b) reluctance influences, c) permanent magnet influences, and d) mechanical influences other than permanent magnet influences, which mechanical influences are dependent on at least one of speed and position of at least one of the movable part and the mechanical components.

31. The method for controlling an electro-mechanical transducer according to claim 26, wherein at least one of the sets of data include ordered sequences of values of comprehensive range and yet sufficiently closely spaced with respect to transducer position to compensate for deviations in operation caused by harmonics of a desired motive force.

32. The method for controlling an electro-mechanical transducer according to claim 26, wherein the obtaining step comprises obtaining an ordered sequence of data from at least one of the two distinct data sets, which ordered sequence of data is variable to match a motive-force-related characteristic of the transducer dependent on a non-linear property of the transducer.

33. The method for controlling an electro-mechanical transducer according to claim 32, wherein the non-linear property of the transducer varies within a respective repetitive portion of the motion of the transducer.

34. The method of controlling an electro-mechanical transducer according to claim 32, wherein the non-linear property of the transducer varies within a representative distance of travel of the transducer.

35. The method for controlling an electro-mechanical transducer according to claim 32, wherein the nonlinear property is one of the group of iron saturation and armature reactive effect, and the step of obtaining data includes the sub-step of switching among the at least two data sets, said data sets embodying iron saturation and armature reactive effect, to obtain the determined value.

36. The method for controlling an electromechanical transducer according to claim 26, wherein the transducer effects an energy conversion and wherein the determining step includes initially measuring at least one of elapsed time, linear or angular position of the movable part and an energy conversion state of the transducer, and thereafter calculating from the measured item the determined value.

* * * * *